United States Patent
Ohno et al.

(10) Patent No.: US 8,274,818 B2
(45) Date of Patent: Sep. 25, 2012

(54) MAGNETORESISTIVE ELEMENT, MAGNETIC MEMORY CELL AND MAGNETIC RANDOM ACCESS MEMORY USING THE SAME

(75) Inventors: Hideo Ohno, Sendai (JP); Shoji Ikeda, Sendai (JP); Young Min Lee, Sendai (JP); Jun Hayakawa, Hino (JP)

(73) Assignees: Tohoku University, Miyagi (JP); Hitachi, Ltd., Tokyo (JP)

( * ) Notice: Subject to any disclaimer, the term of this patent is extended or adjusted under 35 U.S.C. 154(b) by 1017 days.

(21) Appl. No.: 12/185,983

(22) Filed: Aug. 5, 2008

(65) Prior Publication Data

US 2010/0034014 A1  Feb. 11, 2010

(51) Int. Cl.
*G11C 11/00* (2006.01)
(52) U.S. Cl. ........ 365/158; 365/148; 365/171; 365/172; 977/933
(58) Field of Classification Search ............ 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 438/3; 428/810–816, 817–825.1, 428/826; 977/933–935
See application file for complete search history.

(56) References Cited

U.S. PATENT DOCUMENTS

| | | | |
|---|---|---|---|
| 5,695,864 A | 12/1997 | Slonczewski | |
| 2003/0007398 A1* | 1/2003 | Daughton et al. | 365/200 |
| 2004/0061154 A1* | 4/2004 | Huai et al. | 257/295 |
| 2006/0018057 A1* | 1/2006 | Huai | 360/324.2 |
| 2006/0128038 A1* | 6/2006 | Pakala et al. | 438/4 |
| 2007/0019337 A1* | 1/2007 | Apalkov et al. | 360/324.1 |
| 2007/0025029 A1 | 2/2007 | Hayakawa et al. | |
| 2007/0096229 A1* | 5/2007 | Yoshikawa et al. | 257/421 |
| 2007/0258281 A1* | 11/2007 | Ito et al. | 365/158 |
| 2008/0037179 A1* | 2/2008 | Ito et al. | 360/313 |
| 2008/0164547 A1* | 7/2008 | Higo et al. | 257/421 |
| 2008/0225583 A1* | 9/2008 | Guo et al. | 365/173 |
| 2008/0258247 A1* | 10/2008 | Mancoff et al. | 257/421 |
| 2008/0310214 A1* | 12/2008 | Wang et al. | 365/158 |
| 2009/0027810 A1* | 1/2009 | Horng et al. | 360/324.2 |

FOREIGN PATENT DOCUMENTS

| | | |
|---|---|---|
| JP | 2002-305337 | 10/2002 |
| JP | 2005-294376 | 10/2005 |
| JP | 2006-269530 | 10/2006 |

OTHER PUBLICATIONS

Miyazaki, T., Tezuka, N., "Giant Magnetic Tunneling Effect in Fe/Al$_2$O$_3$/FE Junction", Journal of Magnetism and Magnetic materials 139 (1995) L231-L234.

(Continued)

*Primary Examiner* — Alexander Sofocleous
*Assistant Examiner* — Harry W Byrne
(74) *Attorney, Agent, or Firm* — Antonelli, Terry, Stout & Kraus, LLP.

(57) ABSTRACT

Provided is a high-speed and ultra-low-power-consumption nonvolatile memory having a high temperature stability at a zero magnetic field. In a tunnel magnetoresistive film constituting a nonvolatile magnetic memory that employs a writing method using a spin-transfer torque, an insulating layer and a nonmagnetic conductive layer are stacked above a ferromagnetic free layer.

24 Claims, 10 Drawing Sheets

OTHER PUBLICATIONS

Yuasa, Shinji, Nagahama, Taro, Fukushima, Akio, Suzuki, Yoshishige and Ando, Koji, "Giant Room-Temperature Magnetoresistance in Single-Crystal Fe/MgO/Fe Magnetic Tunnel Junctions", NanoElectronics Research Institute, National Institute of Advanced Industrial Science and Technology (AIST), published online Oct. 31, 2004; pp. 868-871.

* cited by examiner

MAGNETORESISTIVE ELEMENT, MAGNETIC MEMORY CELL AND MAGNETIC RANDOM ACCESS MEMORY USING THE SAME

CROSS-REFERENCE TO RELATED APPLICATION

The present application corresponds to Japanese application JP 2007-32420 filed on Feb. 13, 2007, the content of which is hereby incorporated by reference into this application.

BACKGROUND OF THE INVENTION

1. Field of the Invention

The present invention relates to a tunnel magnetoresistive element, and a low-power-consumption, nonvolatile magnetic memory provided with the same.

2. Description of the Related Art

As the tunnel magnetoresistive element to be employed in a highly integrated magnetic memory in the future, known are a tunnel magnetoresistive element using an oxide of Al for an insulating barrier layer (T. Miyazaki and N. Tezuka, J. Magn. Magn. Mater. 139, L231 (1995)), and a tunnel magnetoresistive element using magnesium oxide for an insulating barrier layer (S. Yuasa. et al., Nature Material 3, 868 (2004)). The latter tunnel magnetoresistive element provides a magnetoresistance ratio several times larger than that of the former one. Furthermore, a tunnel magnetoresistive element using CoFeB for a magnetic layer, and a low-power-consumption magnetic memory cell and magnetic random access memory using the tunnel magnetoresistive element are disclosed in Japanese Patent Application Publication No. 2006-269530. Moreover, the conventional nonvolatile magnetic memory is configured of a memory cell in which a tunnel magnetoresistive element is formed on a MOSFET. This is a method, in which the MOSFET is used for switching, and with the use of a current-induced spatial magnetic field which is generated by passing a current through a bit line and a word line, the magnetization direction of the tunnel magnetoresistive element is rotated in order to write information, and the information is read out using an output voltage of the tunnel magnetoresistive element.

Moreover, besides the magnetization rotation using the current-induced spatial magnetic field, known is a so-called spin-transfer torque magnetization reversal method, or synonymously, a spin injection magnetization reversal method, in which the magnetization is rotated by passing a current directly through the magnetoresistive element. This is disclosed in the specification of the U.S. Pat. No. 5,695,864 and Japanese Patent Application Publication No. 2002-305337, for example. Japanese Patent Application Publication No. 2005-294376 discloses a tunnel magnetoresistive element using a free layer having a plurality of ferromagnetic layers stacked with a nonmagnetic layer interposed therebetween in order to stably cause the spin-transfer torque to reverse the magnetization against a penetrating magnetic field from the outside.

SUMMARY OF THE INVENTION

Figure 13A:
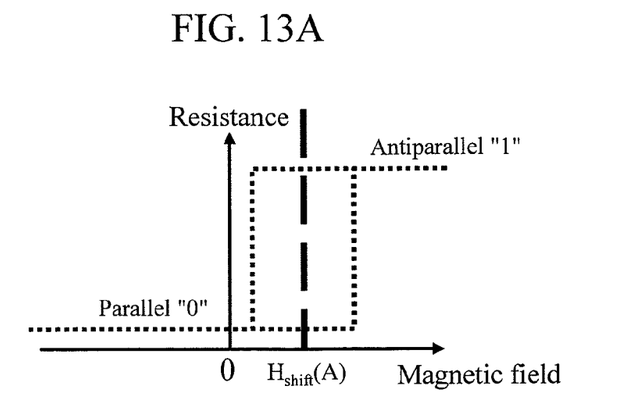
FIG. 13A is a diagram of a minor loop when a magnetic interaction acts between a ferromagnetic free layer and a ferromagnetic pinned layer in a tunnel magnetoresistive element.
Figure 13B:
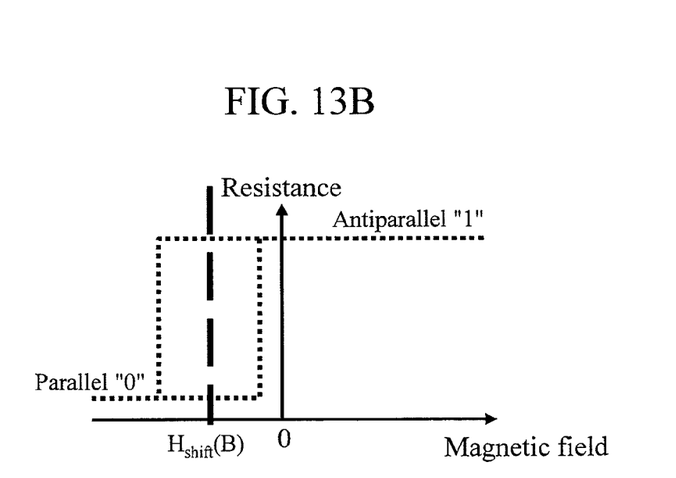
FIG. 13B is a diagram of the minor loop when a magnetic field leaked from an edge portion of the tunnel magnetoresistive element acts on the ferromagnetic free layer.
Figure 13C:
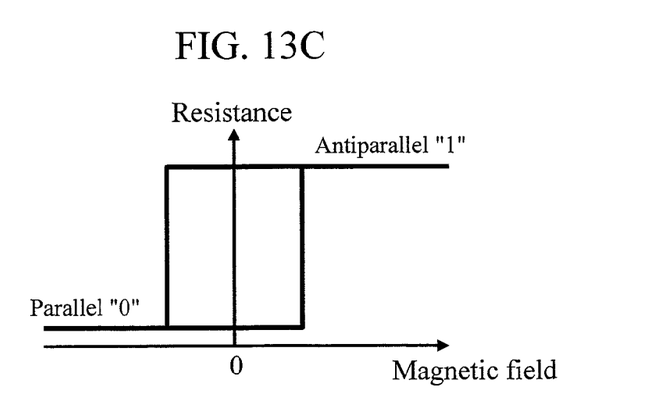
FIG. 13C is a diagram of the minor loop when the effects shown in FIG. 13A and FIG. 13B are added up.

In order to achieve a low-power-consumption nonvolatile magnetic memory having a high reliability, it is necessary to develop a technique that achieves a high thermal stability in a free layer (recording layer) of a high-output tunnel magnetoresistive element as well as a low-current writing method using the spin-transfer torque magnetization reversal, simultaneously. However, in the tunnel magnetoresistive element, since a thin insulating layer having a thickness of about 1 nm is used for a tunnel barrier layer, a magnetic exchange interaction via the insulating layer acts between a ferromagnetic free layer and a ferromagnetic pinned layer, and as shown in FIG. 13A, the center of a minor loop becomes at $H_{shift}(A)$ and thus shifts to the positive direction from the zero magnetic field. In the spin-transfer based magnetization reversal writing, a magnetic field should be applied from the outside to cancel this shifted magnetic field. On the other hand, the size of the tunnel magnetoresistive element used for a large-capacity magnetic memory in the future becomes not larger than 100 nm, and the miniaturization thereof further proceeds. In the miniaturized tunnel magnetoresistive element, a leakage magnetic field is generated from an edge of the magnetic layer, and as shown in FIG. 13B, the center of the minor loop shifts from the zero magnetic field to $H_{shift}(B)$ in the negative direction. The center of the minor loop is determined by adding up the minor loops of FIG. 13A and FIG. 13B. In the application to the actual magnetic memory, the center of this minor loop is required to be adjusted to the vicinity of the zero magnetic field, as shown in FIG. 13C. That is, $H_{shift}(A)+H_{shift}(B) \cong 0$ should be satisfied. Conventionally, a method has been employed, in which the center of the minor loop is controlled to be in the zero magnetic field mainly by adjusting the magnitude of the leakage magnetic field at an edge of the magnetic layer. However, since the magnitude of the leakage magnetic field depends on the material of the magnetic layer or the dimension of the element, the control is extremely difficult, and therefore the center of the minor loop needs to be adjusted accurately to the zero magnetic field using another method.

It is an object of the present invention to provide a tunnel magnetoresistive element being capable of adjusting the center of such minor loop to the zero magnetic field, and having a high stability for the low-current writing and against the thermal disturbance, and to provide a nonvolatile magnetic memory using the same.

In the present invention, on a ferromagnetic free layer of the tunnel magnetoresistive element, being on the opposite side of a ferromagnetic pinned layer, an insulating layer, such as an oxide layer, and a nonmagnetic conductive layer are stacked in this order. If an MgO layer having a (100)-oriented rock salt structure is applied to the insulating layer that constitutes the tunnel barrier layer of the tunnel magnetoresistive element, and a compound ferromagnetic layer having a body-centered cubic lattice of Co or Fe containing B is applied to a ferromagnetic free layer and a ferromagnetic pinned layer, then the best effect can be obtained when the MgO layer having a (100)-oriented rock salt structure that is thinner than the insulating layer (insulating barrier layer) is used for the oxide layer and further a metal conductive layer having a body-centered cubic lattice structure of Cr or the like is used for the nonmagnetic conductive layer.

The tunnel magnetoresistive element of the present invention can be applied to a magnetic memory cell or a magnetic random access memory.

According to the present invention, a low current writing in the precisely zero magnetic field and a high thermal stability therein can be achieved, i.e., a high-output tunnel magnetoresistive element having a long retention time of the magnetic information, can be obtained. Moreover, by providing this tunnel magnetoresistive element in a magnetic memory, a nonvolatile memory can be achieved.

DESCRIPTION OF REFERENCE NUMERALS 1 to 12 . . . tunnel magnetoresistive film
100 . . . transistor
101 . . . first n-type semiconductor
102 . . . second n-type semiconductor
103 . . . p-type semiconductor
21 . . . source electrode
22 . . . drain electrode
23 . . . gate electrode
200 . . . tunnel magnetoresistive film
300 . . . orientation control layer
301 . . . ferromagnetic pinned layer
302 . . . insulating barrier layer
303 . . . ferromagnetic free layer
304 . . . insulating layer
305 . . . nonmagnetic conductive layer
306 . . . protective layer
307 . . . antiferromagnetic layer
3011 . . . first ferromagnetic layer
3012 . . . first nonmagnetic layer
3013 . . . second ferromagnetic layer
3031 . . . third ferromagnetic layer
3032 . . . second nonmagnetic layer
3033 . . . fourth ferromagnetic layer
42 . . . electrode wiring
43 . . . electrode wiring
44 . . . electrode wiring
45 . . . electrode wiring
47 . . . electrode
400 . . . electrode
401 . . . electrode
500 . . . magnetic memory cell

DESCRIPTION OF THE PREFERRED EMBODIMENTS

Hereinafter, embodiments of the present invention will be described with reference to the accompanying drawings. In tunnel magnetoresistive elements described below, the magnetization reversal (switching) of a ferromagnetic free layer is carried out, not by a spatial external magnetic field, but mainly by the spin of a spin-polarized current by providing a torque to the magnetic moment of the ferromagnetic free layer, the spin-polarized current passing through the tunnel magnetoresistive element. The spin-polarized current is generated by applying the current to the tunnel magnetoresistive element. Accordingly, the spin-transfer torque magnetization reversal is achieved by passing a current through the tunnel magnetoresistive element from the outside. The read current that is applied in order to read the magnetization direction of the ferromagnetic free layer of the tunnel magnetoresistive element is set smaller than the write current for causing the magnetization reversal. Hereinafter, the threshold of a current density at which the spin-transfer torque magnetization reversal occurs is defined as Jc.

[Embodiment 1]

Figure 1:
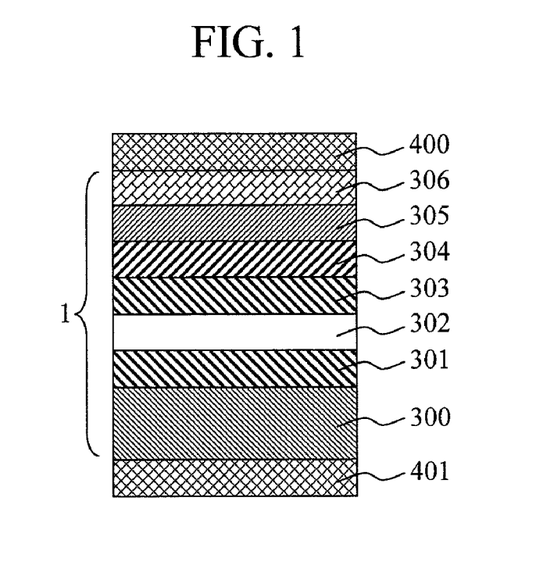
FIG. 1 is a view showing a first configuration example of a tunnel magnetoresistive element of the present invention.

FIG. 1 is a schematic cross sectional view showing an example of a tunnel magnetoresistive element according to the present invention. The tunnel magnetoresistive element of this embodiment is manufactured using a sputtering method. Furthermore, by means of a lithography using a combination of an electron beam lithography system and a stepper, a tunnel magnetoresistive film 1 having a dimension of 100×200 nm² is manufactured in order to implement the spin-transfer torque magnetization reversal. The tunnel magnetoresistive film 1 comprises an orientation control layer 300, a ferromagnetic pinned layer 301, an insulating barrier layer 302, a ferromagnetic free layer 303, an insulating layer 304, a nonmagnetic conductive layer 305, and a protective layer 306. Electrodes 400, 401 are respectively provided in contact with the upper and lower sides of the tunnel magnetoresistive film 1 to constitute the tunnel magnetoresistive element.

Next, a method of writing and reading information in the case where the tunnel magnetoresistive element is applied to a magnetic memory cell or a magnetic random access memory is described.

Firstly, a description is made on the information writing. A voltage or a current is applied to the electrode 400 and the electrode 401 to transmit therethrough in order to generate a spin current, which is generated by passing a current through the tunnel magnetoresistive film 1 in the thickness direction thereof. The spin current thus generated generates a spin transfer torque, and causes the generated spin transfer torque to act on the ferromagnetic free layer 303 to reverse the magnetization direction of the ferromagnetic free layer 303. Then the magnetic information is recorded as "0" when the magnetization direction of the ferromagnetic free layer 303 is parallel to that of the ferromagnetic pinned layer 301, and is recorded as "1" when it is antiparallel thereto, for example. In this case, characteristically, the effect of the present invention can be obtained by the spin current passing through the insulating layer 304 in contact with the ferromagnetic free layer 303 and through the nonmagnetic conductive layer 305.

Next, a description is made on the information reading. A voltage or a current is applied to the electrode 400 and the electrode 401 to transmit therethrough, and then the current or the voltage generated from the tunnel magnetoresistive film 1 is read. By reading the current or voltage, magnetization direction of the ferromagnetic free layer 303 is determined whether it is in parallel or antiparallel with the magnetization direction of the ferromagnetic pinned layer 301, in other words, a relative angle between the magnetization direction of the ferromagnetic free layer 303 and that of the ferromagnetic pinned layer 301 is determined. In this way, the information is read. This is called a tunnel magnetoresistance effect. The tunnel magnetoresistance effect is caused by a change in the resistance that depends on the magnetization direction between the ferromagnetic pinned layer 301 and the ferromagnetic free layer 303. For example, when the magnetization direction of the ferromagnetic free layer 303 is parallel to that of the ferromagnetic pinned layer 301, the voltage of the tunnel magnetoresistive film 1 is low (electric resistance is low, so a current passes easily), while when it is antiparallel thereto, the voltage is high (electric resistance is high, so a current is difficult to pass).

Next, a description is made on a tunnel magnetoresistance ratio (TMR ratio) used in reading the information on the magnetization direction of the ferromagnetic free layer 303 of the tunnel magnetoresistive film 1. The TMR ratio is optimized by heat treating the tunnel magnetoresistive film 1 provided with the electrode 400 and the electrode 401 with the temperature of 500° C. at maximum. Moreover, by applying a magnetic field of 5 T (tesla) at maximum and carrying out heat treatment, the magnetization direction of the ferromagnetic free layer 303 and that of the ferromagnetic pinned layer 301 can be polarized in one direction, and the TMR ratio can be increased.

Figure 2:
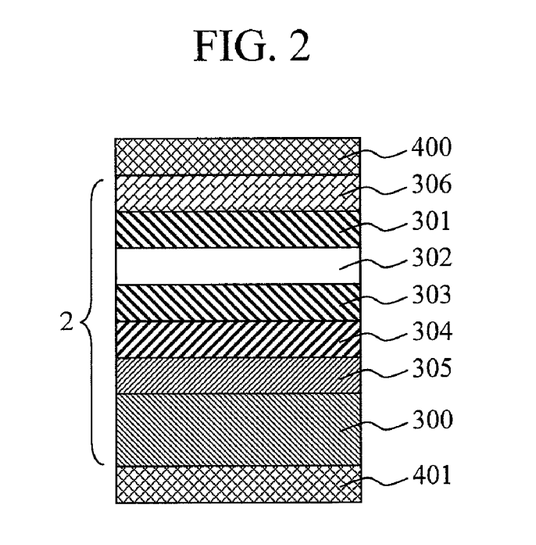
FIG. 2 is a view showing a second configuration example of the tunnel magnetoresistive element of the present invention.

In the tunnel magnetoresistive film 1, the stacking order of the ferromagnetic pinned layer and the ferromagnetic free layer may be reversed similar to a tunnel magnetoresistive film 2 shown in FIG. 2. In the tunnel magnetoresistive film 2 in this case, layers are stacked on the electrode 401 in the following order, specifically, the orientation control layer 300, the nonmagnetic conductive layer 305, the insulating layer 304, the ferromagnetic free layer 303, the insulating barrier layer 302, the ferromagnetic pinned layer 301, and the protective layer 306.

Although the orientation control layer 300 that is used in the tunnel magnetoresistive film 1 and the tunnel magnetoresistive film 2 has a stacked configuration of Ta/NiFe or the like from the electrode 401 side, a multilayered configuration of a combination of materials, such as Ta, Cu, Au, Ru, Ni, Fe, Cr, and Ti, or an alloy layer using these elements, or the like may be used. These materials for the orientation control layer 300 are selected so that the crystal orientation and crystal structure of the ferromagnetic pinned layer 301 or the nonmagnetic conductive layer 305 may be optimized and also the TMR ratio of the tunnel magnetoresistive film 1 and the tunnel magnetoresistive film 2 may become the maximum. For example, if a CoFeB is used for the ferromagnetic pinned layer 301, then the orientation control layer 300 is preferably configured of a layer such as a Ta layer, a Ta/Ru/Ta layer, a Ta/Cu/Ta layer, so that the layer in contact with the ferromagnetic pinned layer 301 is preferably a Ta layer.

For the insulating barrier layer 302, a (100)-oriented MgO (magnesium oxide) having a rock salt structure is preferably used. However, following materials may be used: aluminum oxide (Al—O), aluminum nitride (aluminum-N), magnesium nitride (Mg—N), silicon oxide (Si—O), silicon nitride (Si—N), or titanium oxide (Ti—O); MgO, Al—O, Al—N, Mg—N, Si—O, Si—N, or Ti—O added with Ca, Ba, Sr, V, Ni, Fe, Co, Cu, Ru, Re, Os, Eu, Bi, or Pb; or an oxide of Ca, Ba, Sr, V, Ni, Fe, Co, Cu, Ru, Re, Os, Eu, Bi, or Pb.

The ferromagnetic material used for the ferromagnetic pinned layer 301 and the ferromagnetic free layer 303 is composed of Co, Ni, or Fe, or an alloy using at least one of these. Among the materials, specific material compositions capable of providing a large TMR ratio or a low-current spin-transfer torque magnetization reversal are shown in Table 1. A multilayer structure of the materials shown in Table 1 may be used as the ferromagnetic material.

TABLE 1

$(Co_xFe_{1-x})_{1-y}B_y$
$(0 \leq x \leq 100, 0 \leq y \leq 30)$
(including CoB, FeB)
$(Ni_xFe_{1-x})_{1-y}B_y$
$(0 \leq x \leq 100, 0 \leq y \leq 30)$
(including NiB, FeB)
$(Co_xNi_zFe_{1-x-z})_{1-y}B_y$
$(0 \leq x \leq 100, 0 \leq y \leq 30, 0 \leq z \leq 100)$ Table 1 shows examples of a composition of a Co—Fe based material added with B, a composition of a Ni—Fe based material added with B, and a composition of a Co—Ni—Fe based material added with B. However, other elements except for B may be used as the additive element such as Ta, Ru, Cu, Au, Ti, Cr, Ag, Al, Os, Re, C, O, N, Pd, Pt, Zr, Zn, Ir, W, Mo, Nb. Each of the elements may be used alone, or multiple elements may be used together.

Here, the materials containing boron shown in Table 1 and the manufacturing method thereof will be described taking CoFeB as an example. CoFeB has an amorphous structure in a form of a deposited film. With heat treatment at an appropriate temperature, this CoFeB is crystallized and the TMR ratio increases. For example, if a composition of x=25 atm % and y=20 atm % is used, the CoFeB is crystallized into a body-centered cubic lattice by a heat treatment at no less than 325° C. Alternatively, if CoFeB is used for the ferromagnetic pinned layer 301 and the ferromagnetic free layer 303, then the insulating barrier layer 302 can be formed, in an excellent quality, of MgO layer having a (100)-oriented rock salt structure. With this heat treatment, CoFeB is crystallized into a body-centered cubic lattice having a (100) orientation, having this (100)-oriented MgO layer used as a template. The TMR ratios of the tunnel magnetoresistive film 1 and the tunnel magnetoresistive film 2 manufactured this way, becomes 500% at maximum that can be obtained at room temperature. The materials shown in Table 1 other than CoFeB also undergo a process of crystallization from an amorphous state by heat treatment, as in the case of CoFeB. Next, as a material not containing boron, a case where CoFe corresponding to y=0 atm % is used for the ferromagnetic pinned layer 301 and the ferromagnetic free layer 303 is described as an example. Unlike CoFeB, CoFe is not amorphous but crystalline in a form of a deposited film. In particular, at x=50 atm %, this crystal structure is polycrystalline, in which the body-centered cubic lattice is mainly oriented in the (110) orientation, and the crystal structure does not change even if treated by heat. If the MgO layer is applied to the insulating barrier layer 302 in combination with the CoFe, the crystal structure of MgO and the orientation thereof are formed mainly of the (111)-oriented rock salt structure. The maximum TMR ratio in this case is about 100%.

By combining the insulating layer 304 and the nonmagnetic conductive layer 305 in this order and stacking these in contact with the ferromagnetic free layer 303, the following two effects can be obtained. The effect can not be obtained if any one of the insulating layer 304 and the nonmagnetic conductive layers 305 is missed. Here, a case is described, where an MgO having a (100)-oriented rock salt structure is used for the insulating layer 304 and a Cr having a (100)-oriented body-centered cubic lattice structure is used for the nonmagnetic conductive layer 305, which is a combination yielding the maximum effect in the present invention.

Figure 14:
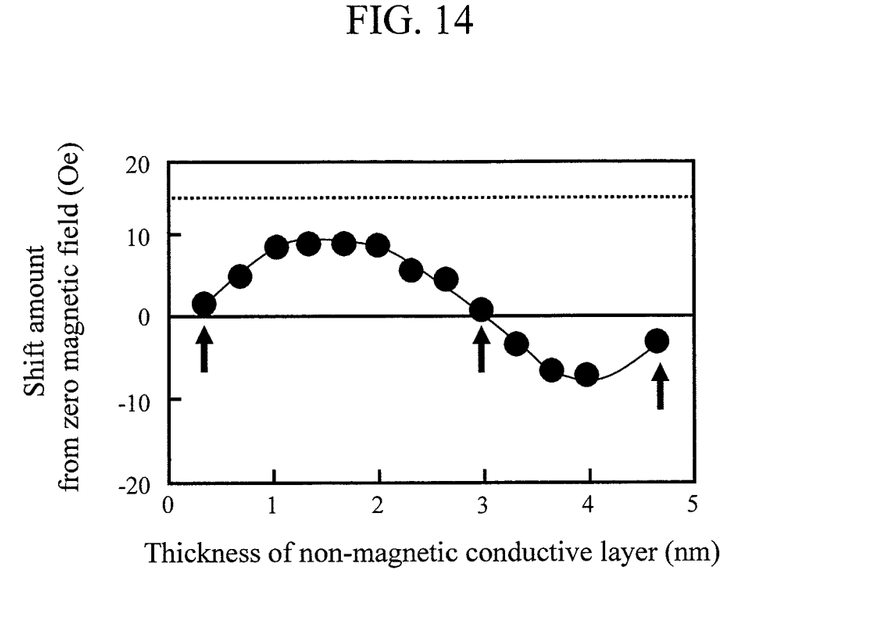
FIG. 14 is a graph showing a relation between a shift amount from the zero magnetic field of a tunnel magnetoresistive element of the present invention and the thickness of the nonmagnetic conductive layer thereof.

First effect is that the shift amount of the minor loop from the zero magnetic field can be controlled. FIG. 14 shows an example of a result of plotting the shift amount of the minor loop from the zero magnetic field corresponding to the Cr film thickness. The shift amount from the zero magnetic field varies in a vibrating manner depending on the Cr film thickness, and some points exits where the shift amount from the zero magnetic field becomes almost zero, when the thickness of the Cr film has around the thickness as indicated by the arrow. However, the result shown here is one example, and the period and magnitude of the vibration vary depending on the materials or the film thicknesses of the ferromagnetic pinned layer 301, the ferromagnetic free layer 303, and the insulating barrier layer 302. Accordingly, the Cr film thickness at which the shift amount from the zero magnetic field becomes zero varies depending on the material composition. The shift amount of the minor loop from the zero magnetic field has conventionally been controlled by adjusting the magnitude of a leakage magnetic field at an edge of the magnetic layer. However, the present invention has a new technique which enables the shift amount from the zero magnetic field to be set to 0 by setting the film thickness of Cr. On the other hand, the data indicated by the dotted line in the graph shows the characteristic when a conductive layer without the body-centered cubic lattice structure is used for the nonmagnetic conductive layer 305. Thus, in the case of a conductive layer without a body-centered cubic lattice structure, the shift amount from the zero magnetic field does not vibrate corresponding to the change in the film thickness of the nonmagnetic conductive layer 305, and therefore the shift amount from the zero magnetic field in this case cannot be controlled by the film thickness of the nonmagnetic conductive layer 305.

Here is the reason. When an electron spin passes through an MgO layer having a (100)-oriented rock salt structure, only electron spin having one direction transmits therethrough selectively. When the electron spin having this one direction enters a conductive layer having a body-centered cubic lattice structure, multiple reflections occur. The amplitude of waves of these electron spins, which are multi-reflected and overlapped to each other, increases or decreases depending on the film thickness of the conductive layer. The intensities of the waves of these overlapped electron spins strengthens or weakens the magnetic coupling between the ferromagnetic pinned layer 301 and the ferromagnetic free layer 303.

Figure 15:
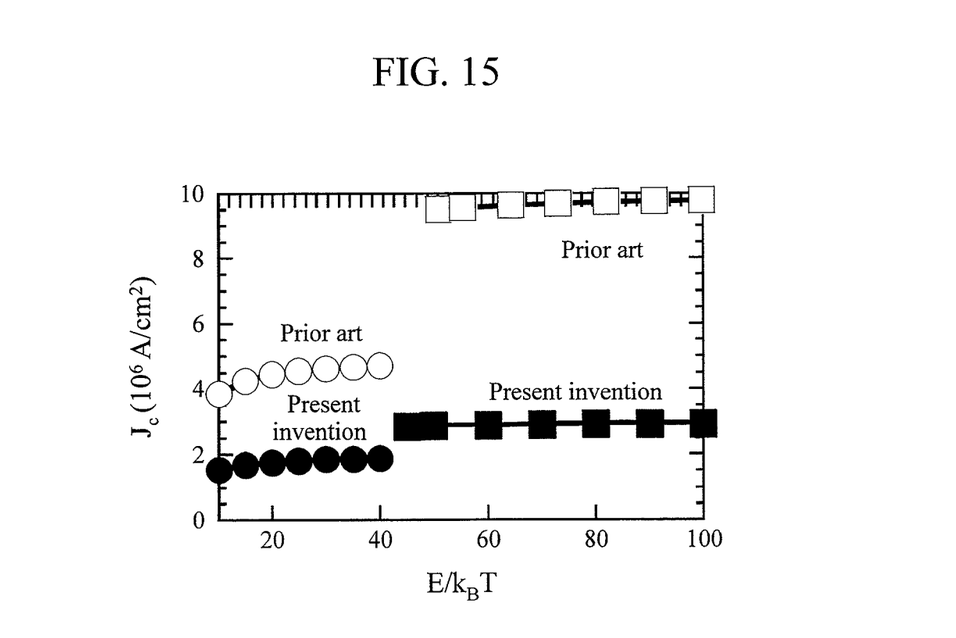
FIG. 15 is a graph showing a relation between Jc of the tunnel magnetoresistive element of the present invention and $E/k_BT$, as compared with a prior art.

Another effect is that the inversion current Jc required for spin-transfer torque magnetization reversal can be reduced while maintaining a high stability against thermal disturbance. The filled circle of FIG. 15 shows a plot result of Jc with respect to $E/k_BT$ (E: magnetization reversal energy, $k_B$: Boltzmann's constant, T: temperature). This is an index of the stability against thermal disturbance when the MgO layer having a (100)-oriented rock salt structure is used for the insulating layer 304 and the Cr having the body-centered cubic lattice structure is used for the nonmagnetic conductive layer in the tunnel magnetoresistive films 1, 2. The open circle in the graph shows the characteristic in the case where the tunnel magnetoresistive films 1, 2 have a conventional structure, in which the insulating layer 304 and the nonmagnetic conductive layer 305 are not included. Jc is proportional to $1-(E/k_BT)^{-1}$, and if the thermal disturbance resistance is attempted to be increased by increasing $E/k_BT$, Jc also increases, thereby causing a problem in realizing the low-power-consumption magnetic memory. This embodiment shows that Jc has been reduced as compared with the conventional structure using the same $E/k_BT$. This is because multiple reflections that depend on the spin orientation of an electron occurs at an interface between the insulating layer 304 and the nonmagnetic conductive layer 305 so that the efficiency of the spin-transfer torque which acts on the ferromagnetic free layer 303 increases.

Now, the detailed description is made for the setting of the thicknesses of the insulating layer 304 and the barrier layer 302. The resistance $R_1$ of the tunnel magnetoresistive film 1 is given by $R_1 \cong R_{302}+R_{304}$, where $R_{302}$ is the resistance generated in the barrier layer 302 and $R_{304}$ is the resistance generated in the insulating layer 304. Furthermore, since $R_{302}$ serves as the resistance that produces the tunnel magnetoresistance effect, $R_{302}$ achieves two states, specifically, a low resistance and a high resistance, respectively, depending on whether the magnetization direction of the ferromagnetic pinned layer 301 and that of the ferromagnetic free layer 303 are parallel to each other or antiparallel to each other. Here, in the $R_{302}$, the low resistance is assumed to be denoted by $R_{302, L}$ and the high resistance denoted by $R_{302, H}$. On the other hand, since $R_{304}$ is a resistance that does not depend on the magnetization directions of the ferromagnetic pinned layer 301 and the ferromagnetic free layer 303 and does not produce the tunnel magnetoresistance effect, $R_{304}$ serves as a parasitic resistance. The TMR ratio is given by $(R_{302, H}+R_{304})/(R_{302, L}+R_{304}) \times 100$ (%).

Figure 18:
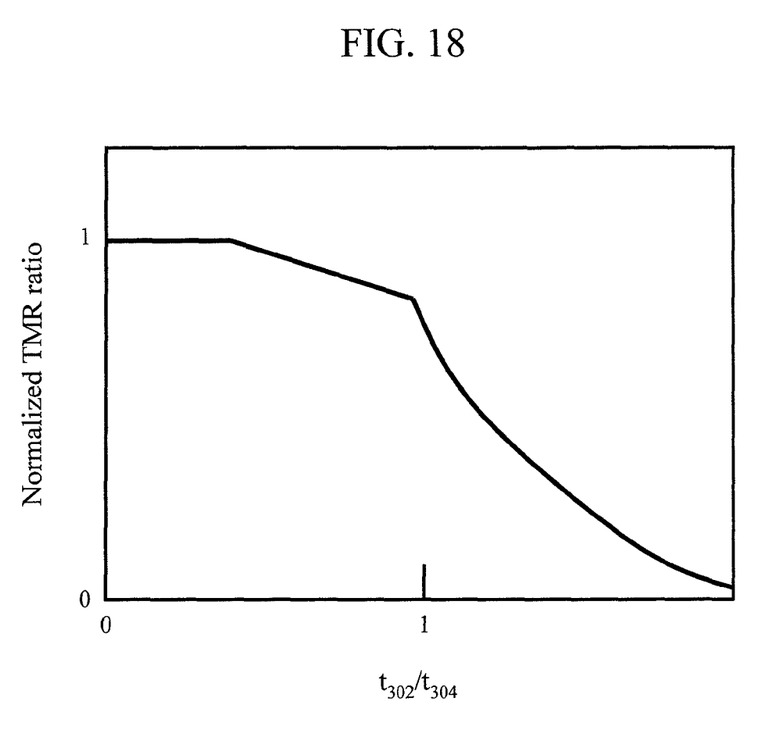
FIG. 18 is a graph showing a variation in a TMR ratio with respect to a ratio $t_{304}/t_{302}$ specifically, $t_{302}$ is the film thickness of a barrier layer and $t_{304}$ is the film thickness of an insulating layer.

FIG. 18 shows a variation in the TMR ratio with respect to $t_{304}/t_{302}$, where $t_{302}$ is set to be the thickness of the barrier layer 302 and $t_{304}$ is set to be the thickness of the insulating layer 304. Since the TMR ratio decreases abruptly when $t_{302}/t_{304}<1$, as shown in FIG. 18, the thickness of the barrier layer 302 needs to be larger than that of the insulating layer 304. Moreover, for the insulating layer 304 having a thickness not larger than 0.5 nm, there is no reduction in the TMR ratio, but the insulating layer cannot be formed in a stable layer structure. Therefore, the control of the center of the minor loop and the Jc reduction effect may be weakened. Accordingly, the thickness of the insulating layer 304 is preferably no less than 0.5 nm. For example, in the method for recording the magnetic information of the ferromagnetic free layer 303 using the spin-transfer torque magnetization reversal, the MgO film thickness is often designed to be around 1 nm. Therefore, the thickness of the insulating layer 304 satisfying the condition of FIG. 18 is preferably set in the range of 0.5 to 0.85 nm.

Next, the features of the material selected for the insulating layer 304 and the nonmagnetic conductive layer 305 are described. As the material that can be used for the insulating layer 304 having the body-centered cubic lattice, the following materials can be used other than the (100)-oriented MgO having the rock salt structure, specifically, aluminum oxide, aluminum nitride, magnesium nitride, silicon oxide, silicon nitride, and titanium oxide; MgO, Al—O, Al—N, Mg—N, Si—O, Si—N, or Ti—O added with Ca, Ba, Sr, V, Ni, Fe, Co, Cu, Ru, Re, Os, Eu, Bi, or Pb; or an oxide of Ca, Ba, Sr, V, Ni, Fe, Co, Cu, Ru, Re, Os, Eu, Bi, or Pb. These materials form a stable thin film even with a thickness not larger than 1 nm. By using the oxide material or nitride material for the insulating layer 304, an electron spin having one direction can transmit through the insulating layer 304 efficiently and flow into the nonmagnetic conductive layer 305, so that the multiple reflection effect of the electron spin can be caused efficiently, and in turn a Jc can be maintained in low. If CoFeB is used for the ferromagnetic pinned layer 301 and the ferromagnetic free layer 303, the (100)-oriented MgO film having the rock salt structure achieves the highest transmission efficiency of the electron spin due to the consistency of electronic structures of the ferromagnetic pinned layer 301 and the ferromagnetic free layer 303.

On the other hand, the (100)-oriented Cr having a body-centered cubic lattice structure is the most preferable for the nonmagnetic conductive layer 305. However, the nonmagnetic conductive layer 305 may be polycrystalline. Moreover, if the MgO having a (100)-oriented rock salt structure is used for the insulating layer 304, a conductive material having a body-centered cubic lattice structure, such as Mo, Nb, Ta, V, or W, is preferably used. These materials can cause multiple reflection of an electron spin that has passed through the insulating layer 304 due to their unique electronic structure.

[Embodiment 2]

Figure 3:
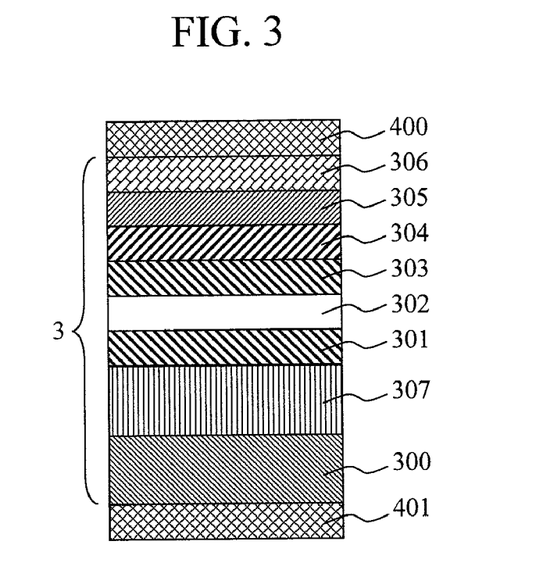
FIG. 3 is a view showing a third configuration example of the tunnel magnetoresistive element of the present invention.
Figure 4:
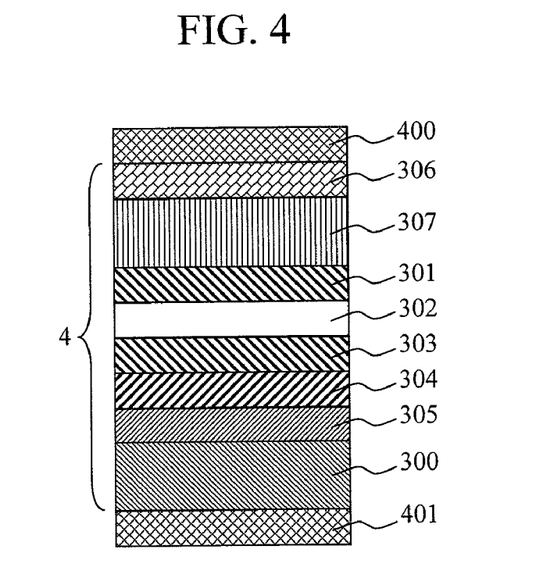
FIG. 4 is a view showing a fourth configuration example of the tunnel magnetoresistive element of the present invention.

FIG. 3 and FIG. 4 are schematic cross sections showing tunnel magnetoresistive elements provided with a tunnel magnetoresistive film 3 and a tunnel magnetoresistive film 4 according to the present invention. The tunnel magnetoresistive film 3 shows a structure, in which an antiferromagnetic layer 307 is provided between the orientation control layer 300 and the ferromagnetic pinned layer 301 on the basis of the structure of the tunnel magnetoresistive film 1, and the tunnel magnetoresistive film 4 shows a structure, in which the antiferromagnetic layer 307 is provided between the ferromagnetic pinned layer 301 and the protective layer 306 on the basis of the structure of the tunnel magnetoresistive film 2, respectively. The layer structure of the tunnel magnetoresistive element of this embodiment and the material and thickness of each layer are the same as those of Embodiment 1 except the antiferromagnetic layer 307.

The antiferromagnetic layer 307 of this embodiment is used to pin the magnetization direction of the ferromagnetic pinned layer 301 firmly and stably in one direction. The magnetization of the ferromagnetic pinned layer 301 in Embodiment 1 is reversed by a magnetic field of around 100 Oe (oersted), while in this embodiment, the magnetization reversal does not occur until the magnetic field becomes 500 Oe, and therefore the magnetization direction can be pinned stability. The material used for the antiferromagnetic layer 307 is preferably an alloy or sintered body containing Mn, so MnIr, MnPt, MnIrCr, MnCrPt, MnFe, and the like can be used. Moreover, other antiferromagnetic layer that does not use Mn may be used. If an antiferromagnetic layer containing Mn is used for the antiferromagnetic layer 307, the magnetization of the ferromagnetic pinned layer 301 can be stabilized and pinned in one direction as described above, however, the resistance against the heat treatment decreases due to the thermal diffusion of Mn. For example, in the tunnel magnetoresistive films 1, 2 that do not use the antiferromagnetic layer 307 containing Mn shown in Embodiment 1, the TMR ratio does not decrease even with the heat treatment at no less than 450° C., however, in the tunnel magnetoresistive films 3, 4 shown in this embodiment, the TMR ratio decreases with the heat treatment at no less than 450° C. Note that, the maximum TMR ratios in the tunnel magnetoresistive film 3 and the tunnel magnetoresistive film 4 are 250% and 200%, respectively.

The tunnel magnetoresistive element using the tunnel magnetoresistive film 3 or the tunnel magnetoresistive film 4 shown in this embodiment also exhibits the characteristic of Jc and $E/k_BT$ as shown in FIG. 15, maintains a high stability against thermal disturbance, and also has a low Jc, as in the case of Embodiment 1. Moreover, by controlling the thickness of the nonmagnetic conductive layer 305, a shift of the minor loop from the zero magnetic field can be reduced to almost zero.

[Embodiment 3]

Figure 5:
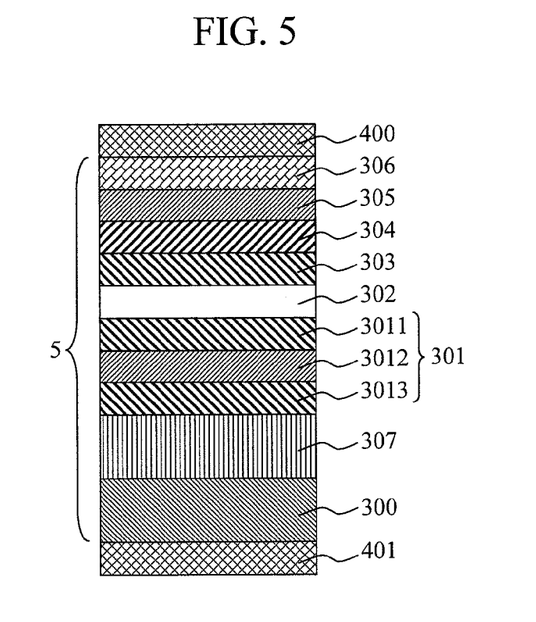
FIG. 5 is a view showing a fifth configuration example of the tunnel magnetoresistive element of the present invention.
Figure 6:
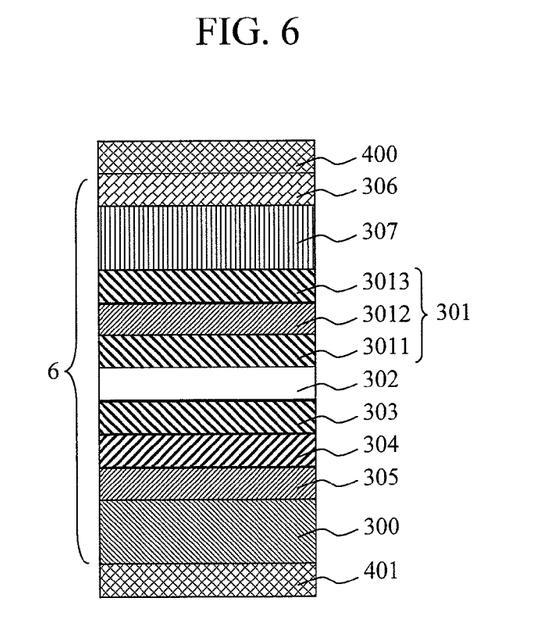
FIG. 6 is a view showing a sixth configuration example of the tunnel magnetoresistive element of the present invention.

FIG. 5 and FIG. 6 are schematic cross sections showing tunnel magnetoresistive elements provided with a tunnel magnetoresistive film 5 and a tunnel magnetoresistive film 6 according to the present invention. The tunnel magnetoresistive film 5 has a structure, in which the ferromagnetic pinned layer 301 comprises a first ferromagnetic layer 3011, a first nonmagnetic layer 3012, and a second ferromagnetic layer 3013 on the basis of the structure of the tunnel magnetoresistive film 3. On the other hand, the tunnel magnetoresistive film 6 has a structure, in which the ferromagnetic pinned layer 301 comprises the first ferromagnetic layer 3011, the first nonmagnetic layer 3012, and the second ferromagnetic layer 3013 on the basis of the structure of the tunnel magnetoresistive film 4. The layer structure of the tunnel magnetoresistive element of this embodiment and the material and thickness of each layer are the same as those of Embodiment 2 except the ferromagnetic pinned layer 301.

The first ferromagnetic layer 3011 and the second ferromagnetic layer 3013 are coupled with the first nonmagnetic layer interposed therebetween with their magnetization directions being antiparallel to each other, and such ferromagnetic pinned layer 301 is referred to as a layered ferri pinned layer. Moreover, the second ferromagnetic layer 3013 is adjacent to the antiferromagnetic layer 307, and the magnetization of the second ferromagnetic layer 3013 is pinned in one direction by the exchange coupling with the antiferromagnetic layer 307, so that the magnetization direction of the ferromagnetic pinned layer 301 is pinned. By applying such layered ferri pinned layer, the magnetization direction can be pinned in one direction stably more than double compared to the case of Embodiment 2. As to the materials used for the first ferromagnetic layer 3011 and the second ferromagnetic layer 3013 shown in this embodiment, materials can be applied, specifically, the materials described in Table 1 shown in Embodiment 1 or the materials used for the ferromagnetic pinned layer described in Embodiment 1. Moreover, the use of Ru is especially preferable for the first nonmagnetic layer 3012, but the first nonmagnetic layer 3012 may be composed of such material that allows the magnetization of the ferromagnetic layer 3011 and that of the second ferromagnetic layer 3013 to couple antiparallel to each other.

The TMR ratio and the characteristic of Jc and $E/k_BT$ of the tunnel magnetoresistive element in this embodiment are the same as those of Embodiment 2. Moreover, by controlling the thickness of the nonmagnetic conductive layer 305, a shift of the minor loop from the zero magnetic field can be reduced to almost zero.

[Embodiment 4]

Figure 7:
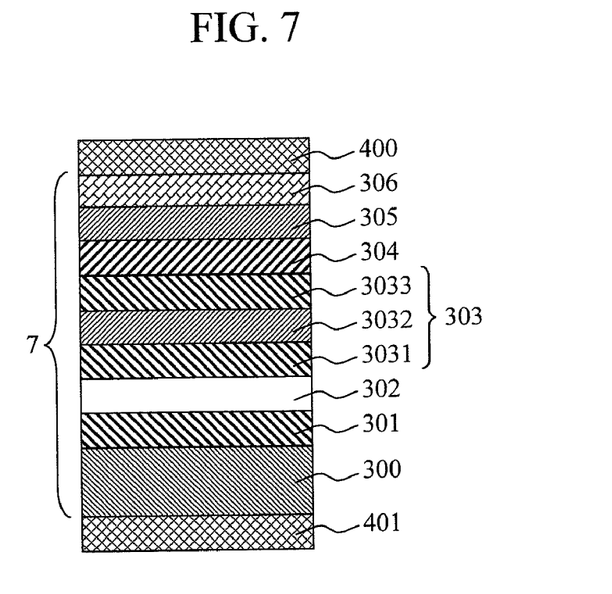
FIG. 7 is a view showing a seventh configuration example of the tunnel magnetoresistive element of the present invention.
Figure 8:
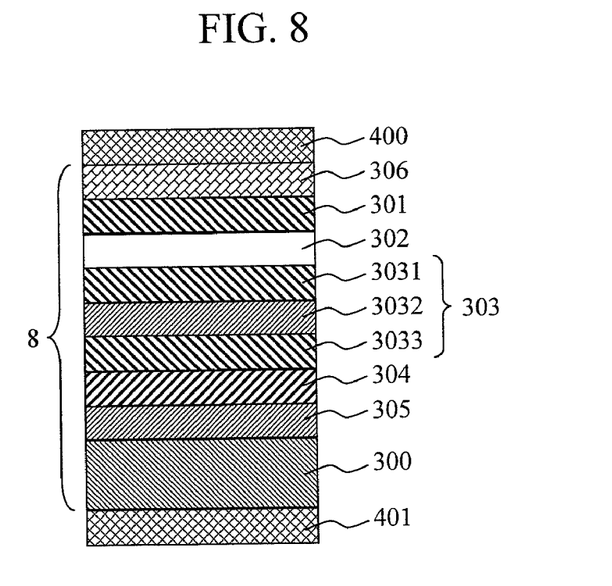
FIG. 8 is a view showing an eighth configuration example of the tunnel magnetoresistive element of the present invention.

FIG. 7 and FIG. 8 show schematic cross sections showing tunnel magnetoresistive elements provided with a tunnel magnetoresistive film 7 and a tunnel magnetoresistive film 8 according to the present invention. The tunnel magnetoresistive film 7 has a structure, in which the ferromagnetic free layer 303 comprises a third ferromagnetic layer 3031, a second nonmagnetic layer 3032, and a fourth ferromagnetic layer 3033 on the basis of the structure of the tunnel magnetoresistive film 1. On the other hand, the tunnel magnetoresistive film 8 has a structure, in which the ferromagnetic free layer 303 comprises the third ferromagnetic layer 3031, the second nonmagnetic layer 3032, and the fourth ferromagnetic layer 3033 on the basis of the structure of the tunnel magnetoresistive film 2. The third ferromagnetic layer 3031 and the fourth ferromagnetic layer 3033 are coupled with the second nonmagnetic layer interposed therebetween with their magnetization directions being antiparallel to each other, and such ferromagnetic free layer 303 is referred to as a layered ferri free layer. The layer structure of the tunnel magnetoresistive element of this embodiment and the material and thickness of each layer are the same as those of Embodiment 1 except the ferromagnetic free layer 303.

As to the materials used for the third ferromagnetic layer 3031 and fourth ferromagnetic layer 3033 that constitute the ferromagnetic free layer 303 shown in this embodiment, materials can be applied, specifically, the materials described in Table 1 shown in Embodiment 1 and the materials used for the ferromagnetic free layer described in Embodiment 1. Moreover, the use of Ru is especially preferable for the second nonmagnetic layer 3032, but the second nonmagnetic layer 3032 may be composed of a material, such as Ir or Cr, which allows the magnetization of the third ferromagnetic layer 3031 and that of the fourth ferromagnetic layer 3033 to couple antiparallel to each other. Moreover, for the ferromagnetic pinned layer 301, the film thickness of the material thereof is set so that the coercive force may be larger as compared with that of the ferromagnetic free layer 303.

A relation between the Jc and $E/k_BT$ of the tunnel magnetoresistive films 7, 8 of this embodiment is shown by the black boxes in FIG. 15. Additionally, the relation of the conventional structure that does not include the insulating layer 304 and the nonmagnetic conductive layer 305 in the tunnel magnetoresistive films 7 and 8 is shown by the white boxes in the view. By applying the layered ferri structure to the ferromagnetic free layer 303 and including the insulating layer 304 and the nonmagnetic conductive layer 305, the stability against thermal disturbance can be increased more than double as compared with the tunnel magnetoresistive films 1 to 6 described in Embodiments 1 to 3, so that a high stability against thermal disturbance can be secured and Jc can be decreased.

In the tunnel magnetoresistive element provided with the insulating layer 304 and the nonmagnetic conductive layer 305, in which the layered ferri structure is applied to the ferromagnetic free layer 303, as in this embodiment, the shift amount of the minor loop from the zero magnetic field can be controlled by varying the thickness of the nonmagnetic conductive layer 305, and the thickness of the nonmagnetic conductive layer 305 can be set so that the shift amount may become zero, as in the method described in Embodiment 1. However, in the layered ferri structure, since the coercive force becomes larger, more than four times, than that of the structure of Embodiment 1, the center of the minor loop can be set to the vicinity of the zero magnetic field more stably.

[Embodiment 5]

Figure 9:
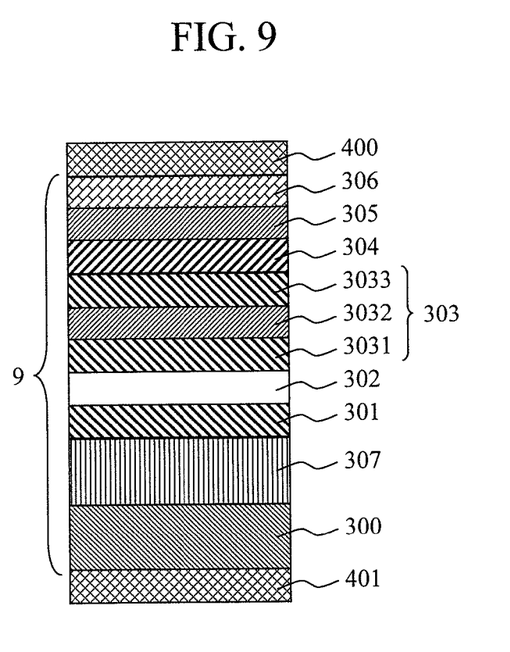
FIG. 9 is a view showing a ninth configuration example of the tunnel magnetoresistive element of the present invention.
Figure 10:
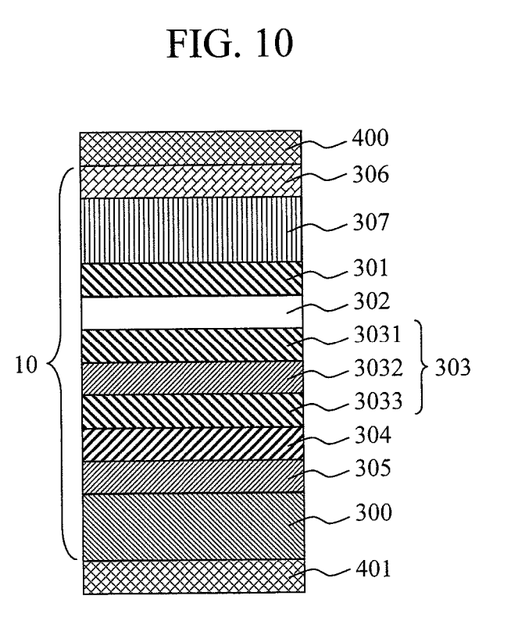
FIG. 10 is a view showing a tenth configuration example of the tunnel magnetoresistive element of the present invention.

FIG. 9 and FIG. 10 are schematic cross sections showing tunnel magnetoresistive elements provided with a tunnel magnetoresistive film 9 and a tunnel magnetoresistive film 10 according to the present invention. The tunnel magnetoresistive film 9 shows a structure, in which the antiferromagnetic layer 307 is provided between the orientation control layer 300 and the ferromagnetic pinned layer 301 on the basis of the structure of the tunnel magnetoresistive film 7 shown in Embodiment 4, and the tunnel magnetoresistive film 10 shows a structure, in which the antiferromagnetic layer 307 is provided between the ferromagnetic pinned layer 301 and the protective layer 306 on the basis of the structure of the tunnel magnetoresistive film 8, respectively. The antiferromagnetic layer 307 of this embodiment is used to pin the magnetization direction of the ferromagnetic pinned layer 301 firmly and stably in one direction. The magnetization of the ferromagnetic pinned layer 301 in Embodiment 4 is reversed by a magnetic field of around 100 Oe, while in this embodiment, the magnetization reversal does not occur until the magnetic field becomes 500 Oe and thus the magnetization direction can be pinned stability. The material used for the antiferromagnetic layer 307 is the same as the material shown in Embodiment 2.

The tunnel magnetoresistive element of this embodiment also exhibits the same characteristics of Jc and $E/k_BT$ as those of Embodiment 4 shown in FIG. 15, maintains a high stability against thermal disturbance, and also has a low Jc. In addition, by controlling the thickness of the nonmagnetic conductive layer 305, a shift of the minor loop from the zero magnetic field can be reduced to almost zero.

[Embodiment 6]

Figure 11:
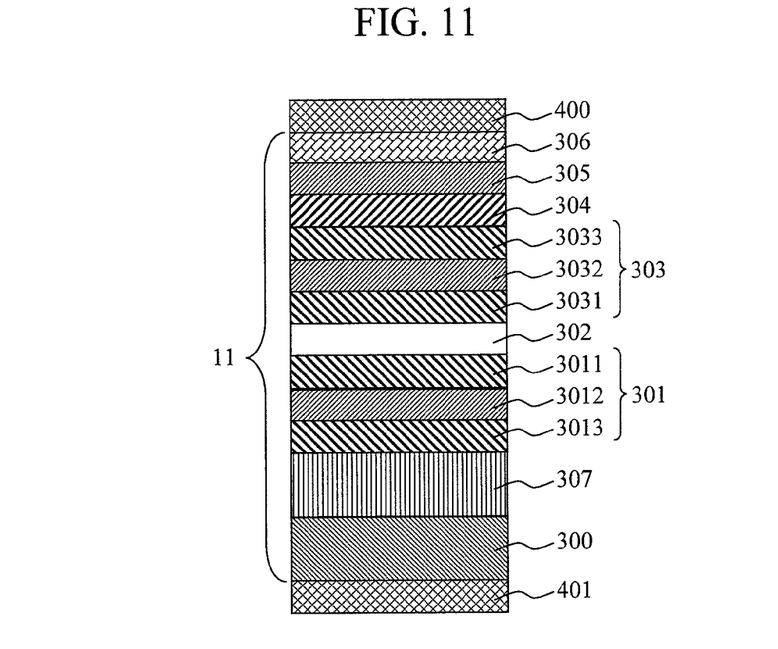
FIG. 11 is a view showing an eleventh configuration example of the tunnel magnetoresistive element of the present invention.
Figure 12:
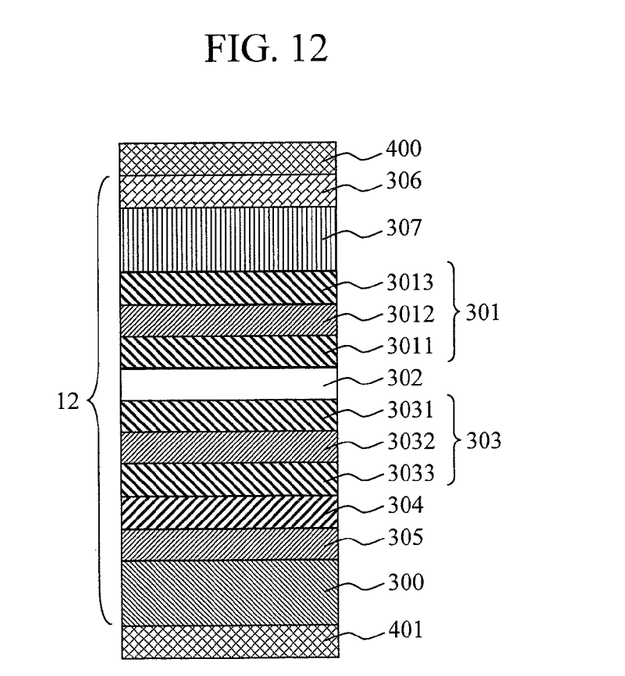
FIG. 12 is a view showing a twelfth configuration example of the tunnel magnetoresistive element of the present invention.

FIG. 11 and FIG. 12 are schematic cross sections of tunnel magnetoresistive elements provided with a tunnel magnetoresistive film 11 and a tunnel magnetoresistive film 12 according to the present invention. The tunnel magnetoresistive film 11 has a structure, in which the ferromagnetic pinned layer 301 comprises the first ferromagnetic layer 3011, the first nonmagnetic layer 3012, and the second ferromagnetic layer 3013 on the basis of the structure of the tunnel magnetoresistive film 9 shown in Embodiment 5. On the other hand, the tunnel magnetoresistive film 12 has a structure, in which the ferromagnetic pinned layer 301 comprises the first ferromagnetic layer 3011, the first nonmagnetic layer 3012, and the second ferromagnetic layer 3013 on the basis of the structure of the tunnel magnetoresistive film 10. The first ferromagnetic layer 3011 and the second ferromagnetic layer 3013 described above constitute a layered ferri pinned layer, in which the magnetization directions thereof are coupled antiparallel to each other, with the first nonmagnetic layer 3012 interposed therebetween. Moreover, the second ferromagnetic layer 3013 is adjacent to the antiferromagnetic layer 307, and the magnetization of the second ferromagnetic layer 3013 is pinned in one direction by the exchange coupling with the antiferromagnetic layer 307, and thus the magnetization direction of the ferromagnetic pinned layer 301 is pinned.

By applying such layered ferri pinned layer, the magnetization direction can be pinned in one direction stably more than double compared to the case of Embodiment 5. As to the materials used for the first ferromagnetic layer 3011 and the second ferromagnetic layer 3013 shown in this embodiment, materials can be applied, specifically, the materials described in Table 1 and the materials used for the ferromagnetic pinned layer described in Embodiment 1. Moreover, the use of Ru is especially preferable for the first nonmagnetic layer 3012, but the first nonmagnetic layer 3012 may be composed of such material that allows the magnetization of the ferromagnetic layer 3011 and that of the second ferromagnetic layer 3013 to couple antiparallel to each other. The TMR ratio of the tunnel magnetoresistive element in this embodiment and the characteristic of Jc and $E/k_BT$ are the same as those of Embodiment 4.

In this embodiment, since a layered ferri structure is applied to both the ferromagnetic pinned layer 301 and the ferromagnetic free layer 303, the leakage magnetic field occurring from an edge of each layer is small. For this reason, adjustment of the center of the minor loop to the zero magnetic field is easy as compared with the tunnel magnetoresistive elements shown in Embodiments 1 to 5.

[Embodiment 7]

Figure 16:
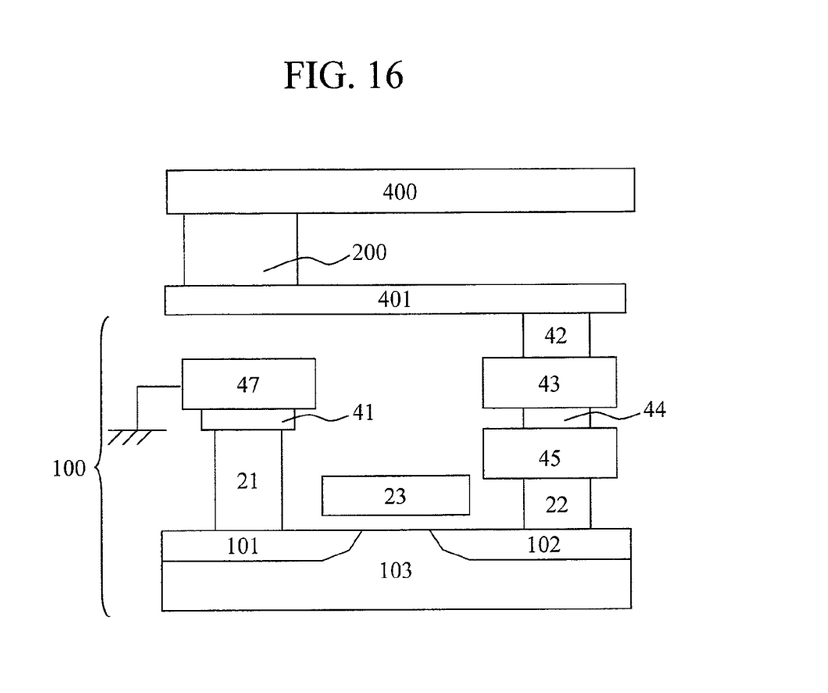
FIG. 16 is a view showing a configuration example of a magnetic memory cell of the present invention.

FIG. 16 is a schematic cross section showing a configuration example of a magnetic memory cell according to the present invention. The tunnel magnetoresistive films 1 to 12 shown in Embodiments 1 to 6 are mounted in a portion shown in the tunnel magnetoresistive film 200 in the drawing.

C-MOS 100 comprises two n-type semiconductors 101, 102 and one p-type semiconductor 103. An electrode 21 serving as the drain is electrically connected to the n-type semiconductor 101, and is connected to the ground via an electrode 41 and an electrode 47. An electrode 22 serving as the source is electrically connected to the n-type semiconductor 102. Furthermore, reference numeral 23 represents a gate electrode. With the on/off operation of this gate electrode 23, the on/off operation of a current passing between the source electrode 22 and the drain electrode 21 is controlled. An electrode 45, an electrode 44, an electrode 43, an electrode 42, and an electrode 401 are stacked above the source electrode 22, and the tunnel magnetoresistive film 200 constituted by either one of the tunnel magnetoresistive films 1 to 12 is connected to the source electrode 22 via the electrode 401. The electrode 401 is connected to the orientation control layer 300 constituting the tunnel magnetoresistive element, similar to the case in Embodiment 1 to Embodiment 6. Here, the electrode 401 shown in FIG. 16 is synonymous with an extended one of the electrode 401 shown in Embodiments 1 to 6.

The electrode 400 is connected to the protective layer 306 of the tunnel magnetoresistive film 200. The electrode 400 can be used also as a bit line of a magnetic memory cell. In the magnetic memory cell of this embodiment, the magnetization direction of the ferromagnetic free layer 303 of the tunnel magnetoresistive film 200 is rotated by a current passing through the tunnel magnetoresistive film 200, or so-called spin-transfer torque, to record magnetic information. The spin-transfer torque is generated based on the principle that not a spatial external magnetic field, but mainly the spin of a spin-polarized current passing through the tunnel magnetoresistive element provides a torque to the magnetic moment of the ferromagnetic free layer 303 of the tunnel magnetoresistive film 200. The principle here has the mechanism in which this spin-polarized current is generated by passing a current through the tunnel magnetoresistive film 200. Accordingly, by providing a means for supplying a current to the tunnel magnetoresistive film 200 from the outside and then by passing a current from this means, the spin-transfer torque magnetization reversal is realized. In this embodiment, a current passes between the electrode 400, which is used also as a bit line, and the electrode 47. Thereby, a spin-transfer torque acts on the ferromagnetic free layer 303 in the tunnel magnetoresistive film 200. When writing is carried out using the spin-transfer torque, the power required in the writing can be reduced to about 1/100 as compared with the case where a current magnetic field is used.

Figure 17:
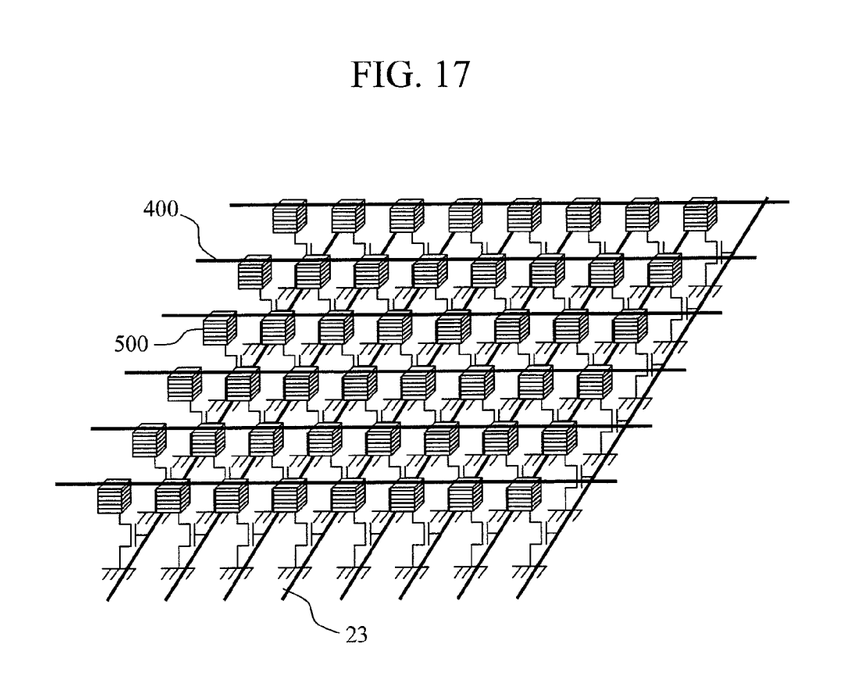
FIG. 17 is a view showing a configuration example of a magnetic random access memory of the present invention.

FIG. 17 is a view showing a configuration example of a magnetic random access memory, in which the magnetic memory cells are arranged. The gate electrode 23 and the electrode 400 functioning also as a bit line are electrically connected to a memory cell 500. The arrangement of the magnetic memory cell allows a low power operation, and allows a gigabit class high-density magnetic memory to be implemented.

What is claimed is:

1. A magnetoresistive element comprising;
   a tunnel magnetoresistive film including:
      a ferromagnetic free layer;
      a ferromagnetic pinned layer;
      a first insulating layer formed between the ferromagnetic free layer and the ferromagnetic pinned layer;
      a second insulating layer formed on a surface, opposite to a surface on the first insulating layer side, of the ferromagnetic free layer; and
      a nonmagnetic conductive layer formed on a surface, opposite to a surface on the ferromagnetic free layer side, of the second insulating layer, wherein the tunnel magnetoresistive film is configured so that:
   when a current is caused to pass in a thickness direction of at least the nonmagnetic conductive layer, the second insulating layer, the ferromagnetic free layer, the first insulating layer, and the ferromagnetic pinned layer, the magnetization of the ferromagnetic free layer is reversed, and
   when a second current is caused to pass in a thickness direction of at least the ferromagnetic free layer, the first insulating layer, and the ferromagnetic pinned layer, a magnetization direction of the ferromagnetic free layer is detected, and
   wherein the thickness of the second insulating layer is equal to or greater than 0.5 nm, and
   wherein the thickness of the first insulating layer is greater than the thickness of the second insulating layer.

2. The magnetoresistive element according to claim 1, wherein the magnetization of the ferromagnetic free layer is reversed by a spin-transfer torque, and the magnetization direction of the ferromagnetic free layer with respect to a magnetization direction of the ferromagnetic pinned layer is detected by a tunnel magnetoresistance effect.

3. The magnetoresistive element according to claim 1, further comprising a pair of electrode layers for causing a current to pass in a thickness direction of the tunnel magnetoresistive film.

4. The magnetoresistive element according to claim 1, further comprising an antiferromagnetic layer for pinning the magnetization direction of the ferromagnetic pinned layer.

5. The magnetoresistive element according to claim 1, wherein the ferromagnetic pinned layer comprises a first ferromagnetic layer and a second ferromagnetic layer, whose magnetization directions are coupled antiparallel to each other, with a nonmagnetic layer being sandwiched therebetween.

6. The magnetoresistive element according to claim 1, wherein the ferromagnetic free layer comprises a first ferromagnetic layer and a second ferromagnetic layer, whose magnetization directions are coupled antiparallel to each other, with a nonmagnetic layer being sandwiched therebetween.

7. The magnetoresistive element according to claim 1, wherein
   the second insulating layer has a thickness smaller than that of the first insulating layer, and is formed of MgO having a (001)-oriented rock salt structure, and
   the nonmagnetic conductive layer is formed of a (100)-oriented Cr having a body-centered cubic lattice structure.

8. The magnetoresistive element according to claim 1, wherein the thickness of the second insulating layer is not greater than 0.85 nm.

9. The magnetoresistive element according to claim 1, wherein the nonmagnetic conductive layer is comprised of Cr.

10. The magnetoresistive element according to claim 8, wherein the nonmagnetic conductive layer is comprised of Cr.

11. A magnetic memory cell comprising:
a tunnel magnetoresistive film including:
    a ferromagnetic free layer;
    a ferromagnetic pinned layer;
    a first insulating layer formed between the ferromagnetic free layer and the ferromagnetic pinned layer;
    a second insulating layer formed on a surface, opposite to a surface on the first insulating layer side, of the ferromagnetic free layer; and
    a nonmagnetic conductive layer formed on a surface, opposite to a surface on the ferromagnetic free layer side, of the second insulating layer,
a means for causing a write current to pass in a thickness direction of at least the nonmagnetic conductive layer, the second insulating layer, the ferromagnetic free layer, the first insulating layer, and the ferromagnetic pinned layer when writing information;
a means for causing a read current to pass in a thickness direction of at least the ferromagnetic free layer, the first insulating layer, and the ferromagnetic pinned layer when reading information; and
a switching element that carries out on-off control of the write current and the read current,
wherein the thickness of the second insulating layer is equal to or greater than 0.5 mm, and
wherein the thickness of the first insulating layer is greater than the thickness of the second insulating layer.

12. The magnetic memory cell according to claim 11, wherein
a magnetization of the ferromagnetic free layer is reversed by a spin-transfer torque, and
a magnetization direction of the ferromagnetic free layer with respect to a magnetization direction of the ferromagnetic pinned layer is detected by a tunnel magnetoresistance effect.

13. The magnetic memory cell according to claim 11, wherein
the second insulating layer has a thickness smaller than that of the first insulating layer, and is formed of an MgO having a (001)-oriented rock salt structure, and
the nonmagnetic conductive layer is formed of a (100)-oriented Cr having a body-centered cubic lattice structure.

14. The magnetic memory cell according to claim 11, further comprising a pair of electrode layers for causing a current to pass in a thickness direction of the tunnel magnetoresistive film.

15. The magnetoresistive element according to claim 11, wherein the thickness of the second insulating layer is not greater than 0.85 nm.

16. The magnetoresistive element according to claim 11, wherein the nonmagnetic conductive layer is comprised of Cr.

17. The magnetoresistive element according to claim 15, wherein the nonmagnetic conductive layer is comprised of Cr.

18. A magnetic random access memory comprising:
a memory cell group, in which a plurality of magnetic memory cells are arranged in a two-dimensional array, each of memory cells including: a magnetoresistive element; a means for causing a write current and a read current to pass into the magnetoresistive element; and a switching element that carries out on-off control of the write current and the read current; and
a selector that selects a desired magnetic memory cell in the memory cell group, wherein
the magnetoresistive element includes:
    a tunnel magnetoresistive film including:
        a ferromagnetic free layer;
        a ferromagnetic pinned layer;
        a first insulating layer formed between the ferromagnetic free layer and the ferromagnetic pinned layer;
        a second insulating layer formed on a surface, opposite to a surface on the first insulating layer side, of the ferromagnetic free layer; and
        a nonmagnetic conductive layer formed on a surface, opposite to a surface on the ferromagnetic free layer side, of the second insulating layer,
    a means for causing the write current to pass in a thickness direction of at least the nonmagnetic conductive layer, the second insulating layer, the ferromagnetic free layer, the first insulating layer, and the ferromagnetic pinned layer; and
    a means for causing the read current to pass in a thickness direction of at least the ferromagnetic free layer, the first insulating layer, and the ferromagnetic pinned layer,
wherein the thickness of the second insulating layer is equal to or greater than 0.5 mm, and
wherein the thickness of the first insulating layer is greater than the thickness of the second insulating layer.

19. The magnetic random access memory according to claim 18, wherein
the write current is caused to pass through the magnetoresistive element, which is selected by the selector, in the magnetic memory cell, so as to reverse a magnetization of the ferromagnetic free layer by a spin-transfer torque, so that information is written.

20. The magnetic random access memory according to claim 18, wherein
the second insulating layer has a thickness smaller than that of the first insulating layer, and is formed of an MgO having a (001)-oriented rock salt structure, and
the nonmagnetic conductive layer is formed of a (100)-oriented Cr having a body-centered cubic lattice structure.

21. The magnetic random access memory according to claim 18, wherein the means for causing a write current and a read current to pass into the magnetoresistive element is a pair of electrodes for causing a current to pass in a thickness direction of the magnetoresistive element.

22. The magnetic random access memory according to claim 18, wherein the thickness of the second insulating layer is not greater than 0.85 nm.

23. The magnetic random access memory according to claim 18, wherein the nonmagnetic conductive layer is comprised of Cr.

24. The magnetic random access memory according to claim 22, wherein the nonmagnetic conductive layer is comprised of Cr.

* * * * *